United States Patent [19]
Sukegawa et al.

[11] Patent Number: 6,034,920
[45] Date of Patent: Mar. 7, 2000

[54] SEMICONDUCTOR MEMORY DEVICE HAVING A BACK GATE VOLTAGE CONTROLLED DELAY CIRCUIT

[75] Inventors: Shunichi Sukegawa; Shinji Bessho, both of Plano, Tex.; Tadashi Tachibana, Miho-mura, Japan; Hiroyuki Yoshida, Plano, Tex.

[73] Assignee: Texas Instruments Incorporated, Dallas, Tex.

[21] Appl. No.: 09/198,816

[22] Filed: Nov. 24, 1998

[51] Int. Cl.$^7$ ............................................. G11C 8/00
[52] U.S. Cl. ................... 365/233.5; 365/207; 365/189.09
[58] Field of Search .............................. 365/233.5, 207, 365/194, 226, 189.09

[56] References Cited

U.S. PATENT DOCUMENTS 5,768,214  6/1998  Saitoh et al. ........................... 365/233.5

*Primary Examiner*—David Nelms
*Assistant Examiner*—David Lam

*Attorney, Agent, or Firm*—Robby T. Holland; Carlton H. Hoel; Richard L. Donaldson

[57] ABSTRACT

A semiconductor memory device has an address buffer (200, 230). A pre-decoder circuit (202, 232) receives the output of the address buffer (200, 230), and a memory array (212) receives the output of the pre-decoder circuit. A main amplifier (216, 248) in turn receives the output of the memory array (212, 244). An address transition detector (ATD) pulse generator circuit (204, 234) also receives the output of the address buffer (200, 230), and a pulse delay circuit (208, 240) receives the output of the address transition detector pulse generator circuit (204, 234). The pulse delay circuit (208, 240) also provides a main amplifier signal to the main amplifier (216, 248). The memory device further includes a voltage generator (206, 236) that generates a back gate voltage which is provided as a low voltage supply ($V_{BB}$) for the address transition detector (ATD) pulse generator circuit (204, 234) and the pulse delay circuit (208, 240). The address transition detector (ATD) pulse generator (204, 234) and the pulse delay circuit (208, 240) have a delay that is controlled by the back gate voltage ($V_{BB}$) and has a reduced dependency on a high voltage supply ($V_{DD}$) of the memory device.

9 Claims, 10 Drawing Sheets

SEMICONDUCTOR MEMORY DEVICE HAVING A BACK GATE VOLTAGE CONTROLLED DELAY CIRCUIT

TECHNICAL FIELD OF THE INVENTION

This invention relates in general to semiconductor memory devices, and more particularly to a semiconductor memory device having a back gate voltage ($V_{BB}$) controlled delay circuit.

BACKGROUND OF THE INVENTION

It has become advantageous to reduce the supply voltage and power consumption of semiconductor chips, and memory devices in particular. As a result, the lower supply voltages and power consumption has generated corresponding scaling methods for forming devices for integrated circuits. One problem with scaling methods is that, since sub-threshold current of transistor devices is fairly constant, the threshold voltage ($V_{TH}$) of transistor devices do not directly follow the scaling method to minimize the standby leakage current. In this situation, in memory devices, the supply voltage dependency of signal access time can become large and cause slow access times.

SUMMARY OF THE INVENTION

In accordance with the present invention, a semiconductor memory device having a back gate voltage ($V_{BB}$) controlled delay circuit is disclosed that provides advantages over prior semiconductor memory device designs.

According to one aspect of the present invention, a semiconductor memory device has an address buffer. A pre-decoder circuit receives the output of the address buffer, and a memory array receives the output of the pre-decoder circuit. A main amplifier in turn receives the output of the memory array. An address transition detector (ATD) pulse generator circuit also receives the output of the address buffer, and a pulse delay circuit receives the output of the address transition detector pulse generator circuit. The pulse delay circuit also provides a main amplifier signal to the main amplifier. The memory device further includes a voltage generator that generates a back gate voltage which is provided as a low voltage supply ($V_{BB}$) for the address transition detector (ATD) pulse generator circuit and the pulse delay circuit. The address transition detector (ATD) pulse generator and the pulse delay circuit have a delay that is controlled by the back gate voltage ($V_{BB}$) and has a reduced dependency on a high voltage supply ($V_{DD}$) of the memory device.

A technical advantage of the present invention is that a delay circuit is provided that has low dependency on the power supply voltage and allows realization of faster data access time.

Further, the delay circuit is composed by a voltage swing level converter and a $V_{BB}$ to $V_{DD}$ voltage swing delay circuit. The delay circuit can use the same voltage supply ($V_{BB}$) as the memory array back gate voltage. Further, the delay circuit can use an independent $V_{BB}$ generator that has voltage level trimming capability to ignore process parameter fluctuation.

Further technical advantages of the present invention should be apparent from the drawings, description and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Figure 1:
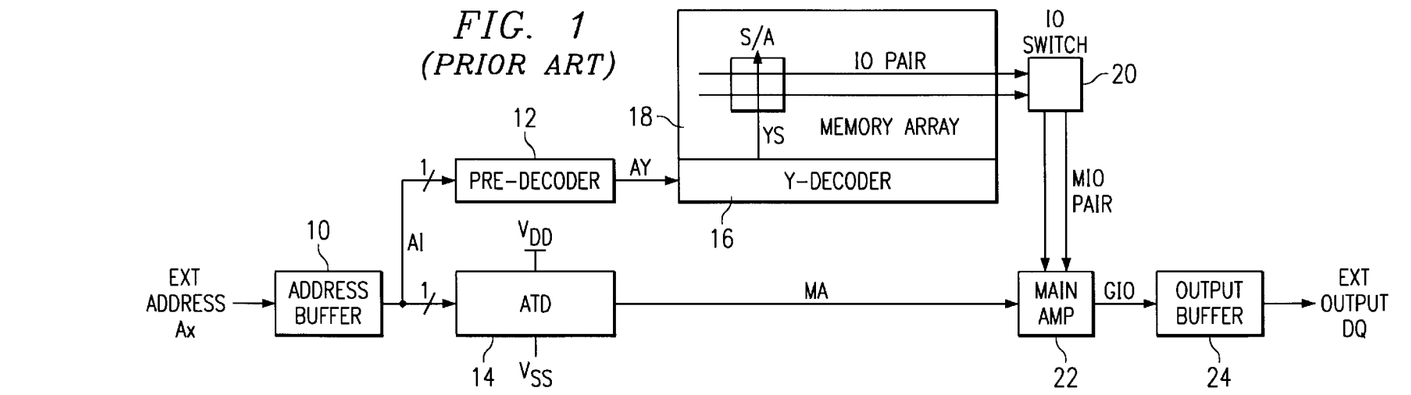
FIG. 1 is a circuit diagram of a conventional address access path of a dynamic random access memory (DRAM) device.

FIG. 1 is a circuit diagram of a conventional address access (tAA) path of a dynamic random access memory (DRAM) device. As shown, an external address (Ax) is provided to an address buffer 10. Address buffer 10 is coupled to a pre-decoder circuit 12 and an address transition detector (ATD) circuit 14. Pre-decoder circuit 12 is coupled to a Y-decoder circuit 16 which is coupled to a memory array 18. Memory array 18 provides an output to an I/O switch 20 which in turn provides signals to a main amplifier 22. ATD circuit 14 also provides a signal to main amplifier 22. Main amplifier 22 provides an output to an output buffer 24 which in turn provides an external output (DQ).

FIG. 1 shows a typical address access (tAA) path for a DRAM. After the external address (Ax) has been switched, the output signal of address buffer 10 (AI) is provided. The signal (AI) is connected to both pre-decoder circuit 12 and ATD circuit 14. Thus, the access path is divided into two paths at this point. One path is through memory array 18 which uses the following signals to reach main amplifier 22: AY, YS, IO pair, MIO pair. The signal (AY) is the output signal of pre-decoder circuit 12 which is provided to Y-decoder circuit 16. Y-decoder circuit 16 drives the signal (YS) on a Y-select line into memory array 18 and selects one of the sense amplifiers within memory array 18. The selected sense amplifier drives data to main amplifier 22 through I/O switch 20 on IO pair and MIO pair lines. As can be understood from FIG. 1, the delay time of the memory array path is mainly composed by the RC delay of long signal lines.

The other signal path is the ATD path. The output signal (MA) of ATD circuit 14 is an enable signal for main amplifier 22. Signal (MA) must wait for the data from memory array 18 and enables main amplifier 22 when the MIO pair cause enough of a voltage difference. As should be understood, the ATD path delay is mainly composed of intrinsic circuit delay. The access time for the memory device of FIG. 1 corresponds essentially to the signal (MA). Fast (MA) causes fast access time, but limited by the MIO speed because MA must occur after MIO data is present. Thus, fast access time design can be achieved by minimizing the MIO to MA timing margin.

However, a problem with the minimum timing margin design is the power voltage dependency of the delay time for the above to access paths. Since the memory array path is composed of RC delay, it has a relatively small dependency on power supply voltage. However, the ATD path is composed of circuit delay and therefore has a relatively large dependency on the power voltage. As a result, even if the MIO and MA timing is designed with minimum margin in a high voltage condition, the timing margin will be larger in a low voltage condition if the ATD path has large voltage dependency. Therefore, the delay circuit of the present invention has been provided which has low dependency on power supply voltage and allows realization of faster access time.

Figure 2A:
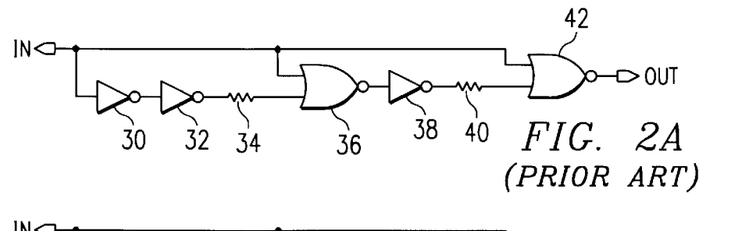
FIGS. 2A and 2B are circuit diagrams of possible delay circuits that realize low dependency on supply voltage.

FIGS. 2A and 2B are circuit diagrams of possible delay circuits that realize low dependency on supply voltage. As shown in FIG. 2A, an inverter 30 and an inverter 32 are coupled in series to a resistor 34. The input signal is then provided as one input to a NOR gate 36 as well as the signal through resistor 34. The output of NOR gate 36 is provided to an inverter 38 which in turn feeds a resistor 40. The input signal is then provided as an input to another NOR gate 42 which also receives the voltage on resistor 40. The circuit of FIG. 2A uses resistive devices (such as diffusion layer resistance) in the delay circuit. In general, this circuit requires that resistors 34 and 40 cover a large surface area to provide sufficiently low voltage dependency. As a result, although this circuit realizes low dependency, it produces a problem of large layout area. The layout area becomes two or three times larger than the transistor delay circuit to realize the low dependency on supply voltage.

Figure 2B:
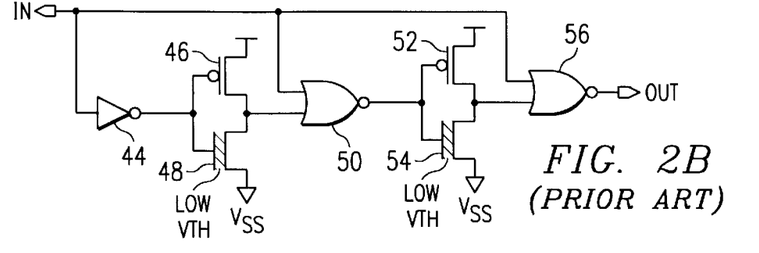

FIG. 2B shows an alternate circuit that has an inverter 44 which feeds a P-channel transistor 46 and N-channel transistor 48 pair. In turn, a NOR gate 50 receives the input signal as well as the output of the transistor pair 46 and 48. The output of NOR gate 50 feeds another P-channel transistor 52 and N-channel transistor 54 pair which in turn provides an input to a NOR gate 56. As shown, the other input of NOR gate 56 is the input signal. This circuit also suffers from problems. In general, the circuit of FIG. 2B uses low threshold voltage transistors for the delay devices. The use of these transistors causes the same effect as following the scaling methods. As a result, the problem exists of large standby leakage currents and additional process steps to increase the threshold voltage.

Figure 3:
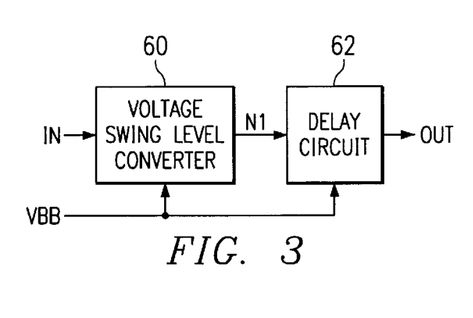
FIG. 3 is a block diagram of a delay circuit constructed according to the present invention.

FIG. 3 is a block diagram of a delay circuit constructed according to the present invention. As shown, the delay circuit includes a voltage swing level converter 60 which receives an input signal (IN). The level converter 60 provides an output signal (N1) to a delay circuit 62. Delay circuit 62 in turn provides an output signal (OUT) as shown. Both voltage swing level converter 60 and delay circuit 62 receive a back gate voltage $V_{BB}$ as the low supply. In operation, voltage swing level converter 60 changes the voltage swing of the input signal (IN) from $V_{SS}$–$V_{DD}$ to $V_{BB}$–$V_{DD}$ at the intermediate signal (N1). Delay circuit 62 then, in turn, operates with a $V_{BB}$–$V_{DD}$ signal swing.

Figure 4:
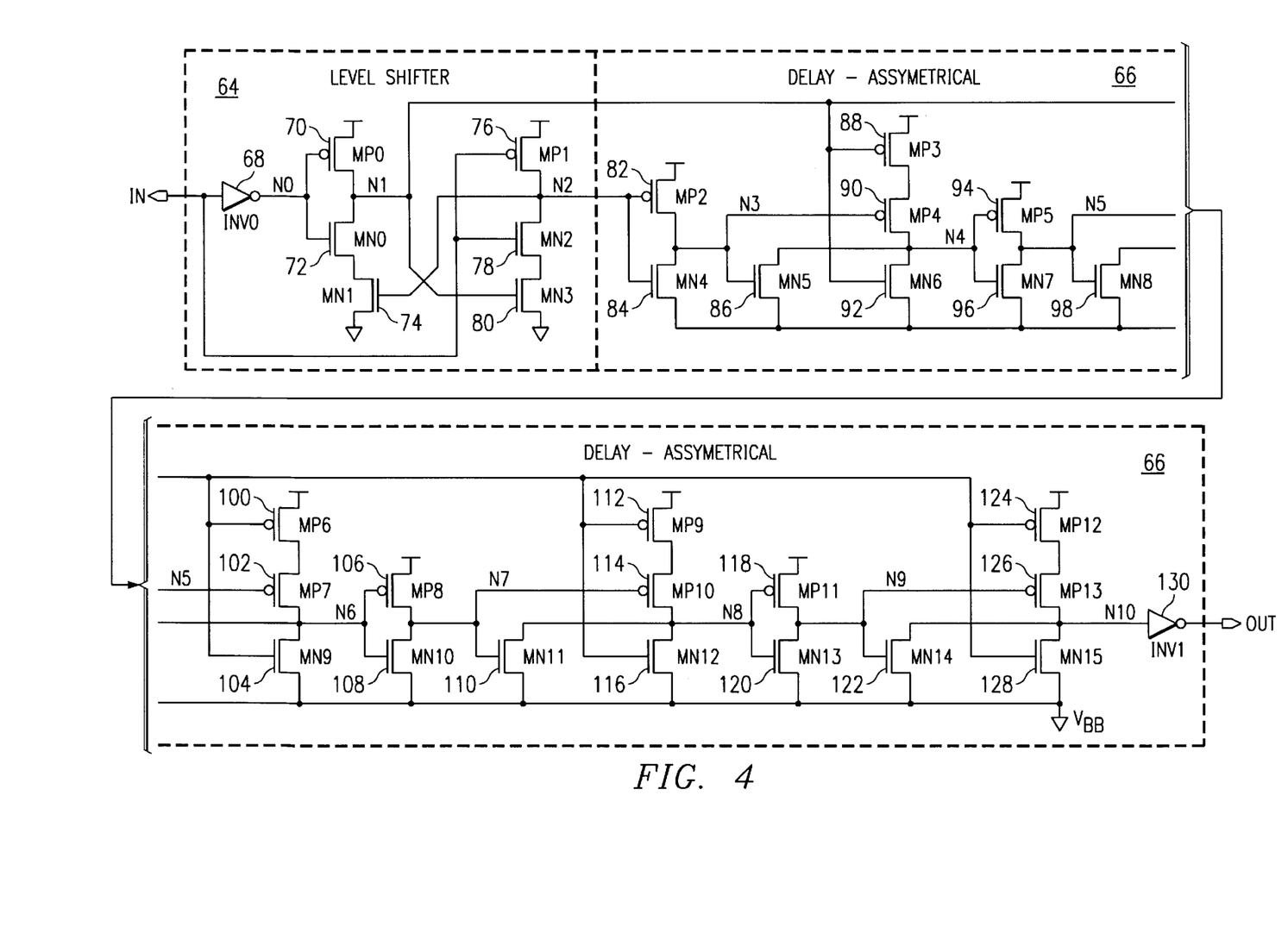
FIG. 4 is a circuit diagram of one implementation of the delay circuit of FIG. 3 according to the present invention.

FIG. 4 is a circuit diagram of one implementation of the delay circuit of FIG. 3 according to the present invention. The circuit of FIG. 4 can form ATD circuit 14 of FIG. 1. As shown in FIG. 4, a level shifter circuit 64 (analogous to level converter 60 of FIG. 3) is coupled to a delay circuit 66. Level shifter circuit 64 includes an inverter 68, a P-channel transistor 70, an N-channel transistor 72, an N-channel transistor 74, a P-channel transistor 76, and two N-channel transistors 78 and 80 connected as shown. These devices receive a high voltage supply, $V_{DD}$, and a low voltage supply, $V_{BB}$, as shown. Level shifter circuit 64 receives the input signal (IN) which has a swing from $V_{SS}$–$V_{DD}$ and converts the signal to a signal that has a $V_{BB}$–$V_{DD}$ swing.

Delay circuit 66 includes a P-channel transistor 82 and an N-channel transistor 84 that receive the output of the level shifter circuit 64. These transistors then feed two P-channel transistors 88 and 90 and N-channel transistors 86 and 92. The next stage includes P-channel transistor 94 and N-channel transistor 96. A similar structure is then obtained by transistors 100, 102, 104, 106, 108 and 110. Again, a similar structure is provided by transistors 112, 114, 116, 118, 120 and 122. Lastly, transistors 124, 126 and 128 feed an inverter 130. The devices within delay circuit 66 operate to convert the $V_{BB}$–$V_{DD}$ swing of the output of level shifter 64 and delay that output.

Figure 5:
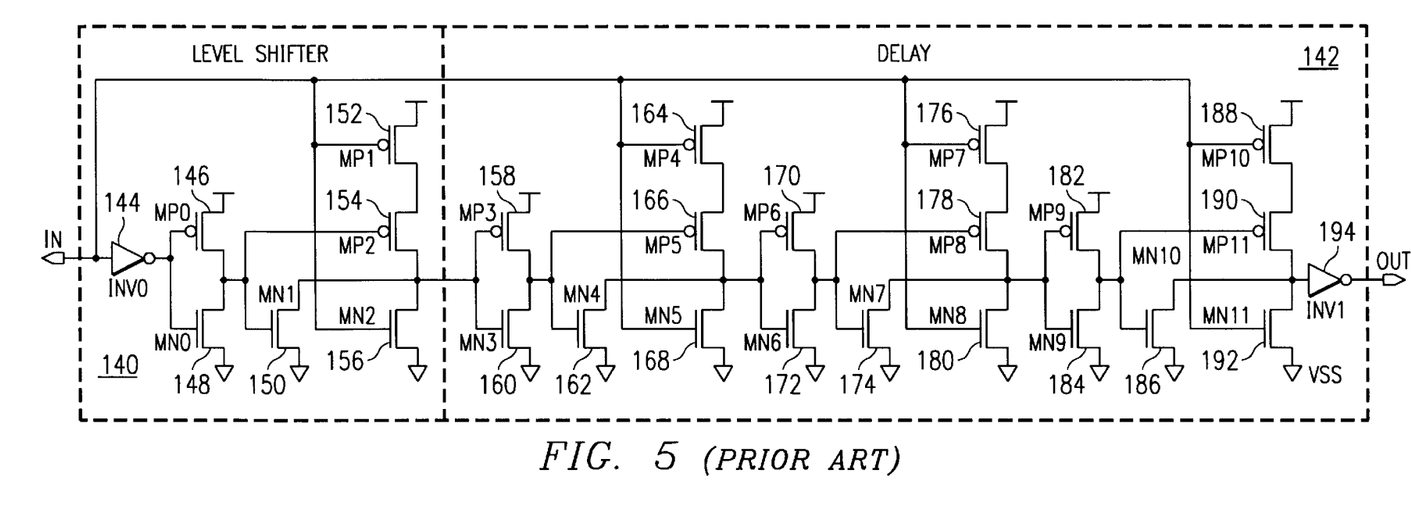
FIG. 5 is a circuit diagram of one implementation of a conventional delay circuit which can be contrasted with the delay circuit of FIG. 4.

FIG. 5 is a circuit diagram of one implementation of a conventional delay circuit which can be contrasted with the delay circuit of FIG. 4. The function of the circuit of FIG. 5 is similar to that of FIG. 4 except for level shifter circuit 140 and the voltage swing level of $V_{SS}$–$V_{DD}$. As shown in FIG. 5, level shifter circuit 140 is connected to a delay circuit 142. Level shifter circuit 140 includes an inverter 144, and transistors 146, 148, 150, 152, 154 and 156 interconnected as shown. This stage feeds delay circuit 142 which includes P-channel transistors 158, 164, 166, 170, 176, 178, 182, 188 and 190 as well as N-channel transistors 160, 162, 168, 172, 174, 180, 184, 186 and 192. These transistors are interconnected as shown and then feed an inverter 194 which provides an output signal (OUT) for the circuit. As can be seen, a major difference between FIG. 4 and FIG. 5 is the structure of the level shifter circuit 140 and the connection of the source terminals of the N-channel transistors to $V_{SS}$ as opposed to $V_{BB}$. These differences allow the circuit of FIG. 4 to operate with a delay time that has lower dependency on the supply voltage.

Figure 6:
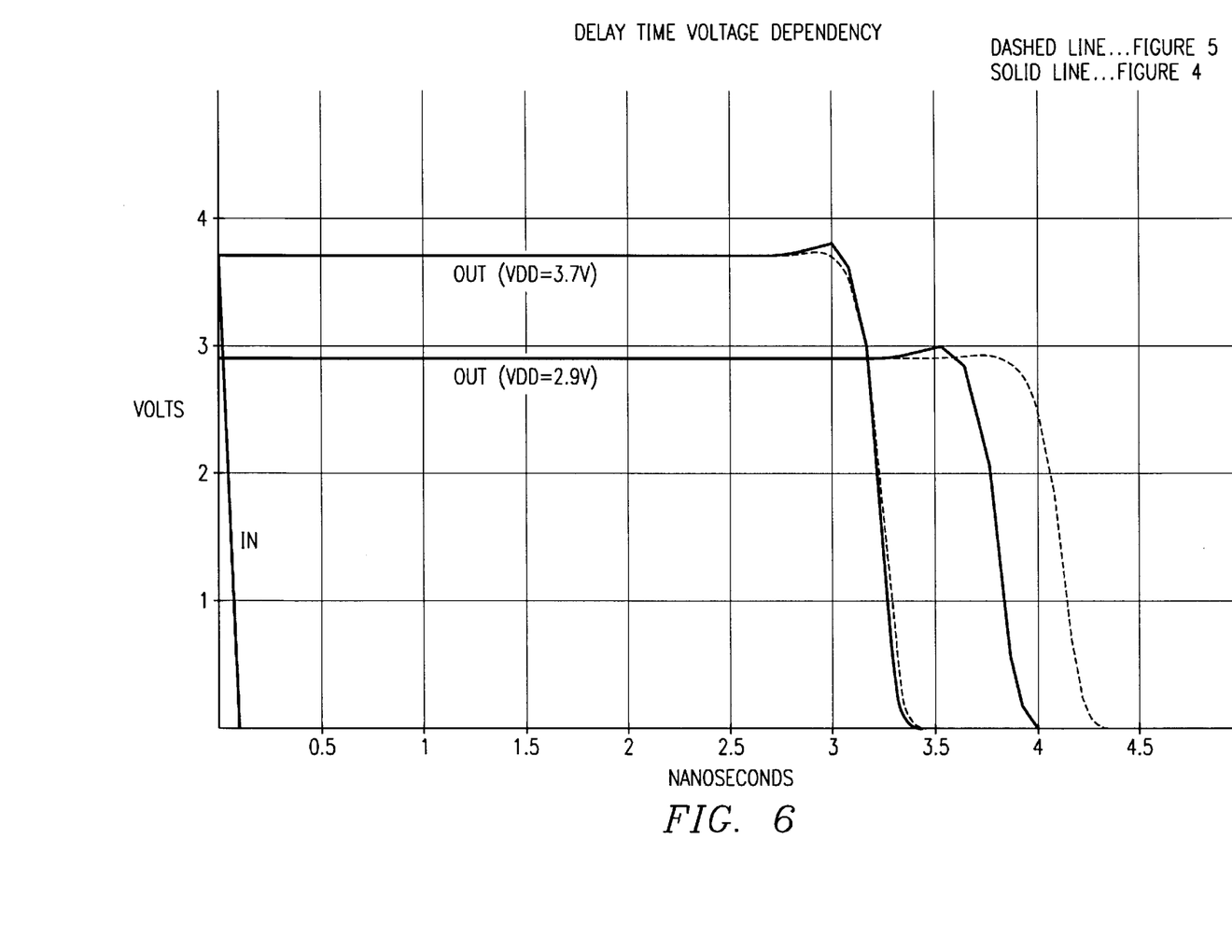
FIG. 6 is a diagram of voltage versus time which shows delay time voltage dependency for the circuits of FIG. 4 and FIG. 5.

FIG. 6 is a diagram of voltage versus time which shows delay time voltage dependency for the circuits of FIG. 4 and FIG. 5. As shown, as the supply voltage level drops, the delay change is smaller for the circuit of FIG. 4 than for the circuit of FIG. 5. For this example, the transistor parameters were designed to produce the same delay for both circuits where $V_{DD}$ equals 3.7 volts. The dashed line shows the characteristics of conventional circuit of FIG. 5, and the sold line shows the circuit of FIG. 4. As shown in FIG. 6, there is a distinct difference in delay when the supply voltage is reduced such that $V_{DD}$ equals 2.9 volts. The circuit of FIG. 4 has a shorter delay against the conventional circuit of FIG.

5. This means that the circuit of FIG. 4 has a lower dependency on the power supply voltage in terms of circuit delay. The diagram of FIG. 6 was generated for a back gate voltage ($V_{BB}$) of –1.0 volts. It is a recognized concern that any fluctuation in the back gate voltage ($V_{BB}$) might affect the beneficial operation of the circuit of FIG. 4.

Figure 7:
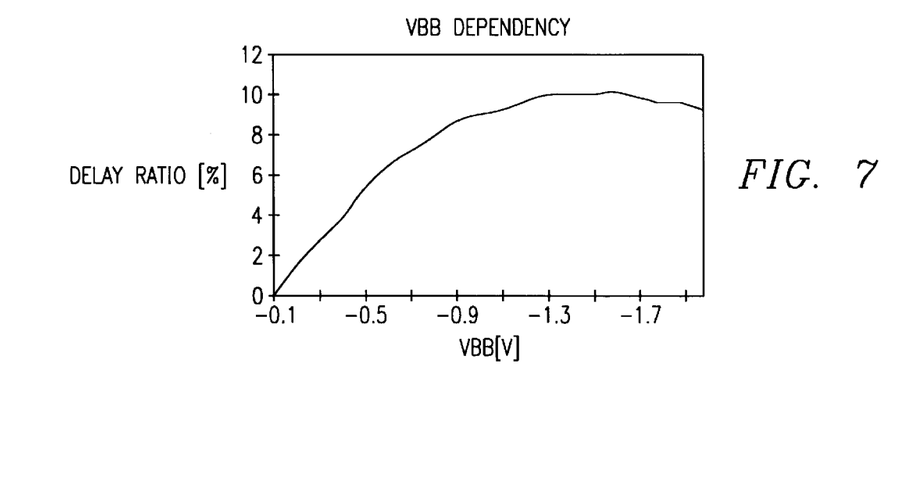
FIG. 7 is a diagram of one embodiment of the back gate voltage ($V_{BB}$) dependency of the delay ratio for the circuit of FIG. 4.

FIG. 7 is a diagram of one embodiment of the back gate voltage ($V_{BB}$) dependency of the delay ratio for the circuit of FIG. 4. The delay ratios were determined for a change of $V_{DD}$ from 3.7 volts to 2.9 volts for a given back gate voltage ($V_{BB}$). As shown in FIG. 7, the $V_{BB}$ level dependency of delay time is negligible when $V_{BB}$ is –1 volt or less.

The drive current of a transistor can be expressed with the below equation:

$$DRIVE\ CURRENT\ (ID) = \frac{W}{L} KP(V_{GS} - V_{TH})^2$$

Where, $V_{GS}$ is equal to $V_{DD}$ in the delay circuit such as FIG. 5 (conventional circuit). Therefore, the ID change ratio depends on power supply voltage expressed as follows:

$$ID\ RATIO\ (V_{DD1}\ \text{and}\ V_{DD2}) = \frac{ID1}{ID2} = \frac{(V_{DD1} - V_{TH})^2}{(V_{DD2} - V_{TH})^2}$$

Assuming the definite condition for the simulation of FIG. 6 conventional delay circuit as $$V_{DD1} = 2.9V\ \ V_{DD2} = 3.7V\ \ V_{TH} = 0.8V$$

$$\frac{ID1}{ID2} = \frac{4.41}{8.41} = 52.4\%$$

then,
This result means the drive current of transistors in the 2.9 volt condition are driving only 52.4% of the drive current compared to the 3.7 volt condition in the conventional delay circuit of FIG. 5.

However, the same assumption for the delay circuit of FIG. 4 is provided below.

$$V_{DD1} = 2.9V - (V_{BB}) = 2.9V - (-1V) = 3.9V$$

$$V_{DD2} = 3.7V - (V_{BB}) = 3.7V - (-1V) = 4.7V$$

$$V_{TH} = 0.8V$$

$$\frac{ID1}{ID2} = \frac{9.61}{15.21} = 63.2\%$$

As seen above, the circuit of FIG. 4 having $V_{BB}$ as the low supply voltage has a transistor drive at 63.2% of drive current in the 2.9 volt condition against the 3.7 volt condition.

This comparison means that the delay circuit of FIG. 4 has a low delay time dependency against the power voltage fluctuation compared to the circuit of FIG. 5. One concern, as mentioned above, is that the $V_{BB}$ level is assumed constant during above analysis. However, $V_{BB}$ is usually generated by a boot pumping circuit, and the $V_{BB}$ level has a dependency on the $V_{DD}$ level. Never the less, the dependency of the pumped $V_{BB}$ level is not linear in proportion to the $V_{DD}$ level and usually the dependency is small against $V_{DD}$. Also, in some DRAMs, $V_{BB}$ is controlled very stably using a reference voltage regulator to keep the electrical field of the memory cell array constant and to get a high pause refresh characteristic. Therefore, a constant $V_{BB}$ can be assumed without significant risk to circuit performance.

Figure 8:
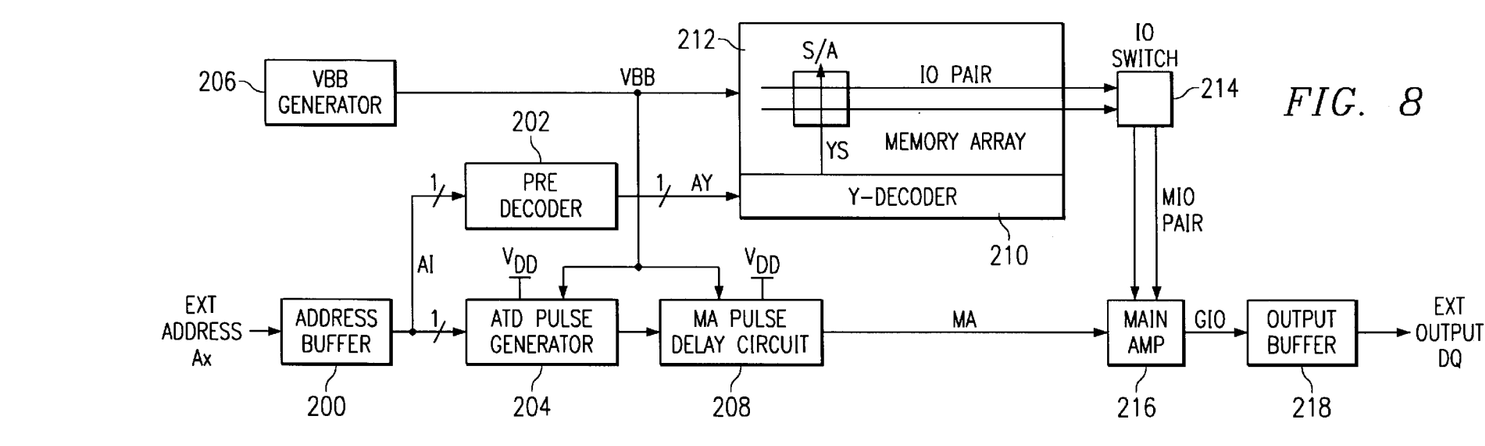
FIG. 8 is a block diagram of one embodiment of a memory device constructed according to the present invention.

FIG. 8 is a block diagram of one embodiment of a memory device constructed according to the present invention. As shown, a common $V_{BB}$ voltage is supplied to both the memory array, ATD pulse generator and MA pulse delay circuit. In the memory device of FIG. 8, address buffer 200 receives the external address (Ax) and provides signals to pre-decoder circuit 202 and ATD pulse generator 204. A back gate voltage ($V_{BB}$) generator 206 provides a $V_{BB}$ voltage to a memory array 212 as well as to ATD pulse generator 204 and MA pulse delay circuit 208. A Y-decoder 210 is coupled to memory array 212 and receives a signal from pre-decoder 202. Memory array 212 provides signals to an I/O switch 214 which in turn drives signals to a main amplifier 216. Main amplifier receives a signal from MA pulse delay circuit 208 and provides a signal-to-output buffer 218. Output buffer 218 in turn provides the external output (DQ).

Figure 9A:
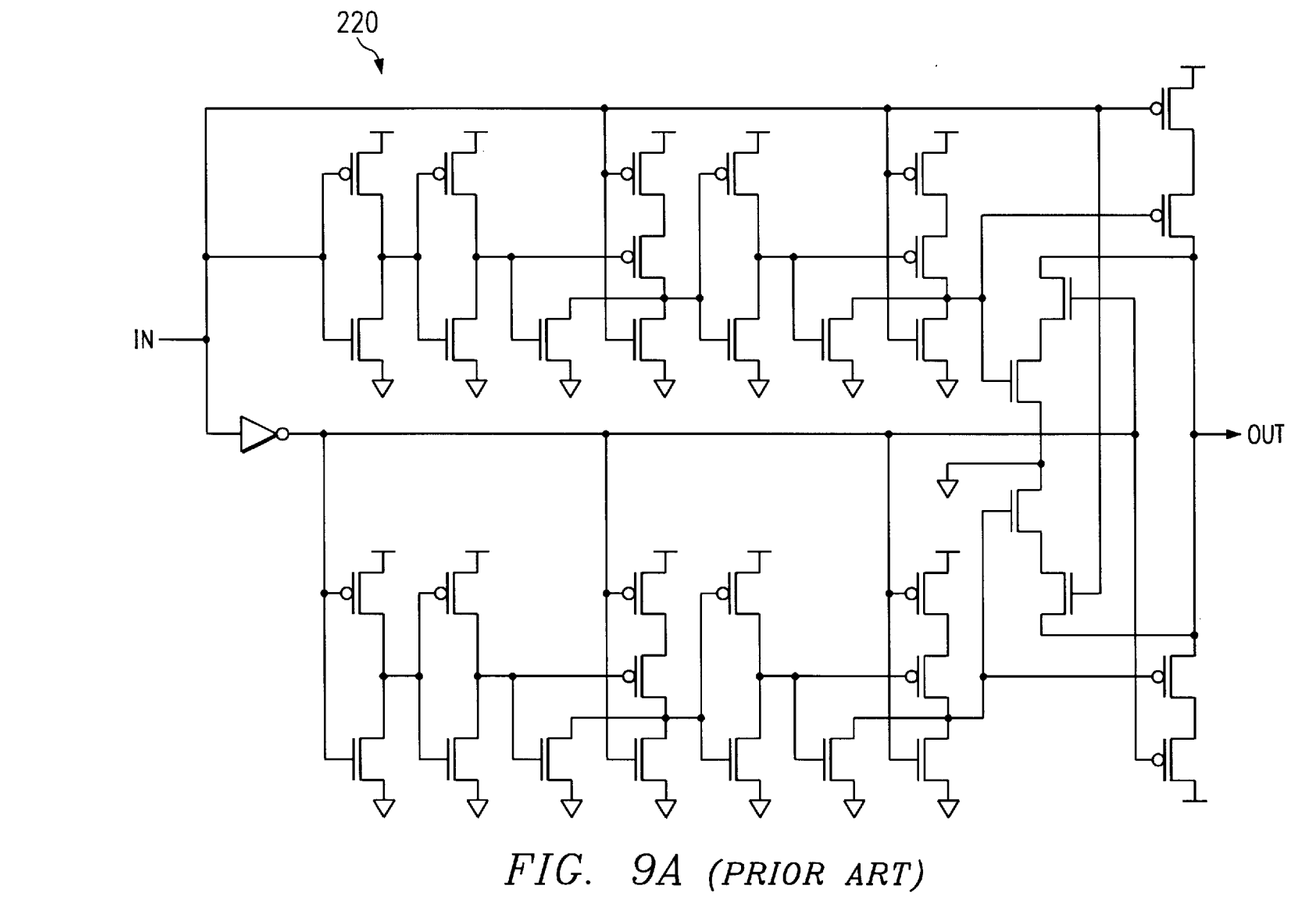
FIGS. 9A and 9B are circuit diagrams of a conventional implementation and an implementation according to the present invention for the ATD pulse generator circuit of FIG. 8.
Figure 9B:
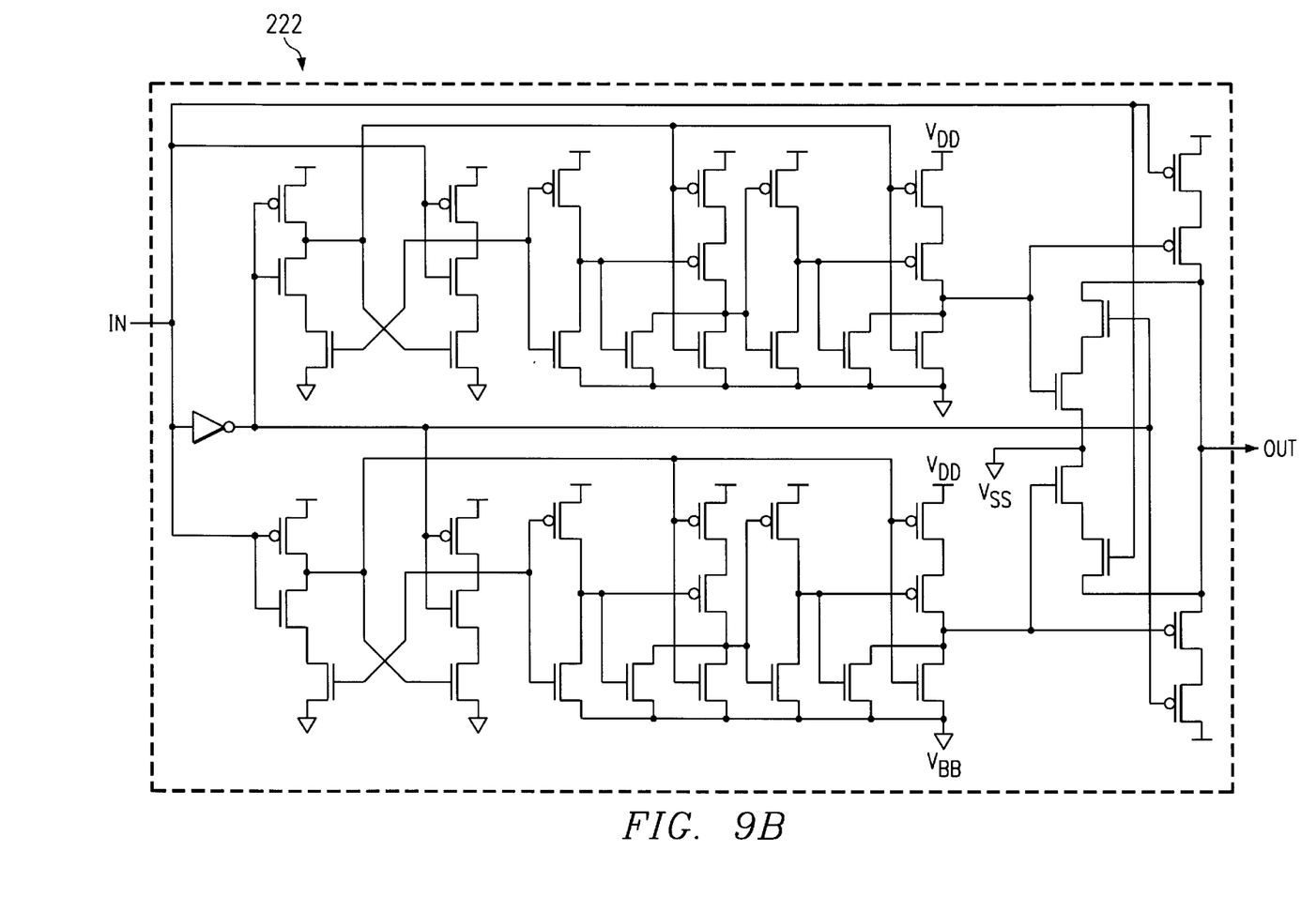

FIGS. 9A and 9B are circuit diagrams of a conventional implementation and an implementation according to the present invention for ATD pulse generator circuit 204 of FIG. 8. As shown in FIG. 9A, a conventional pulse generator circuit 220 includes transistors connected as shown with $V_{SS}$ serving as the low supply voltage. As shown in FIG. 9B, pulse generator circuit 222 includes transistors connected as shown with $V_{BB}$ serving for the most part as the low supply voltage.

Figure 10A:
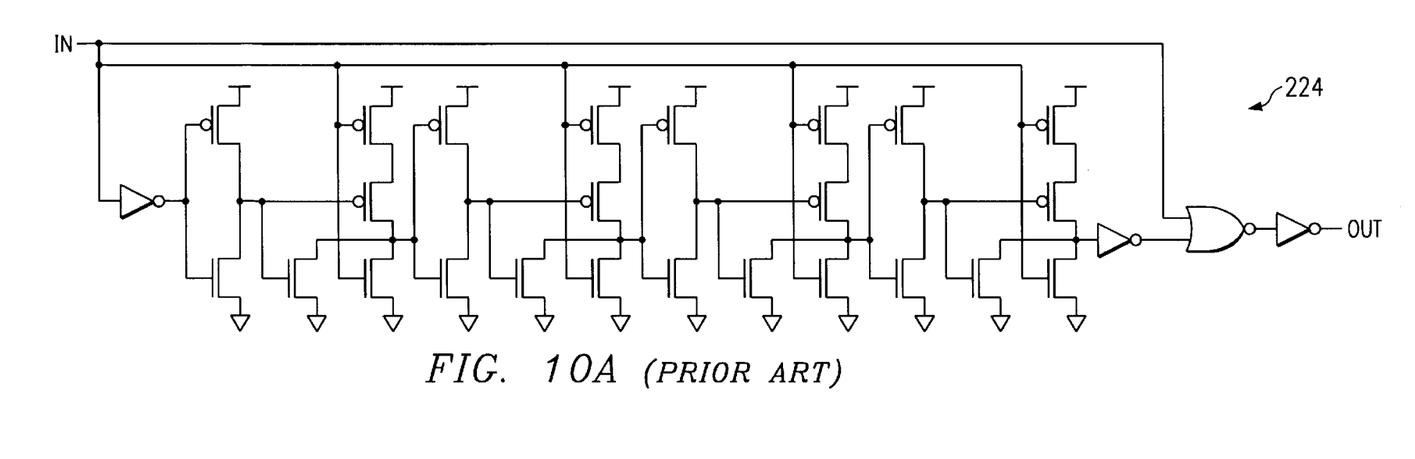
FIGS. 10A and 10B are circuit diagrams of a conventional implementation and an implementation according to the present invention for the MA pulse delay circuit of FIG. 8.
Figure 10B:
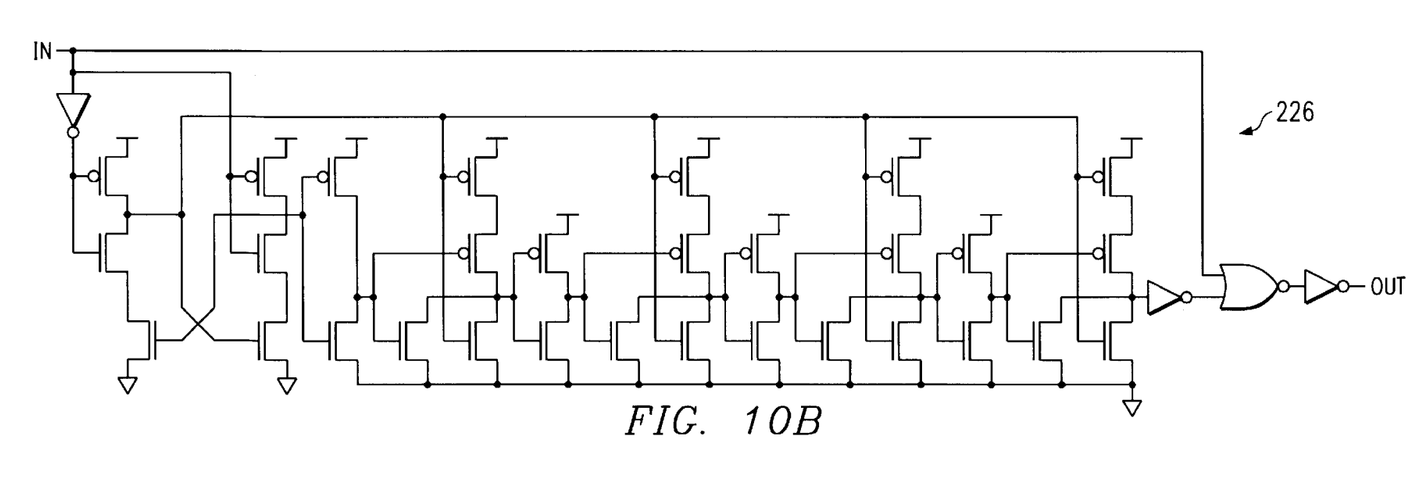

FIGS. 10A and 10B are circuit diagrams of a conventional implementation and an implementation according to the present invention for MA pulse delay circuit 208 of FIG. 8. The circuit 224 of FIG. 10A is a conventional circuit, while circuit 226 of FIG. 10B is constructed according to the present invention. As shown, a significant difference between the two circuits is that the low voltage supply of circuit 224 is $V_{SS}$ while that of circuit 226 is $V_{BB}$.

To show the improved performance provided by the present invention, an access speed simulation for the address access (tAA) can be done for the memory device of FIG. 8. In this simulation, ATD pulse generator 204 and MA pulse delay circuit 208 have been modified according to the present invention as set forth above in FIGS. 9A and 9B and FIGS. 10A and 10B, respectively. The transistor parameters are designed to get the same delay speed for both circuits in a fast access speed condition where $V_{DD}$ equals 3.7 volts, Ta equals 0° Celsius, and a transistor drive current of +3 sigma fluctuation.

Figure 11:
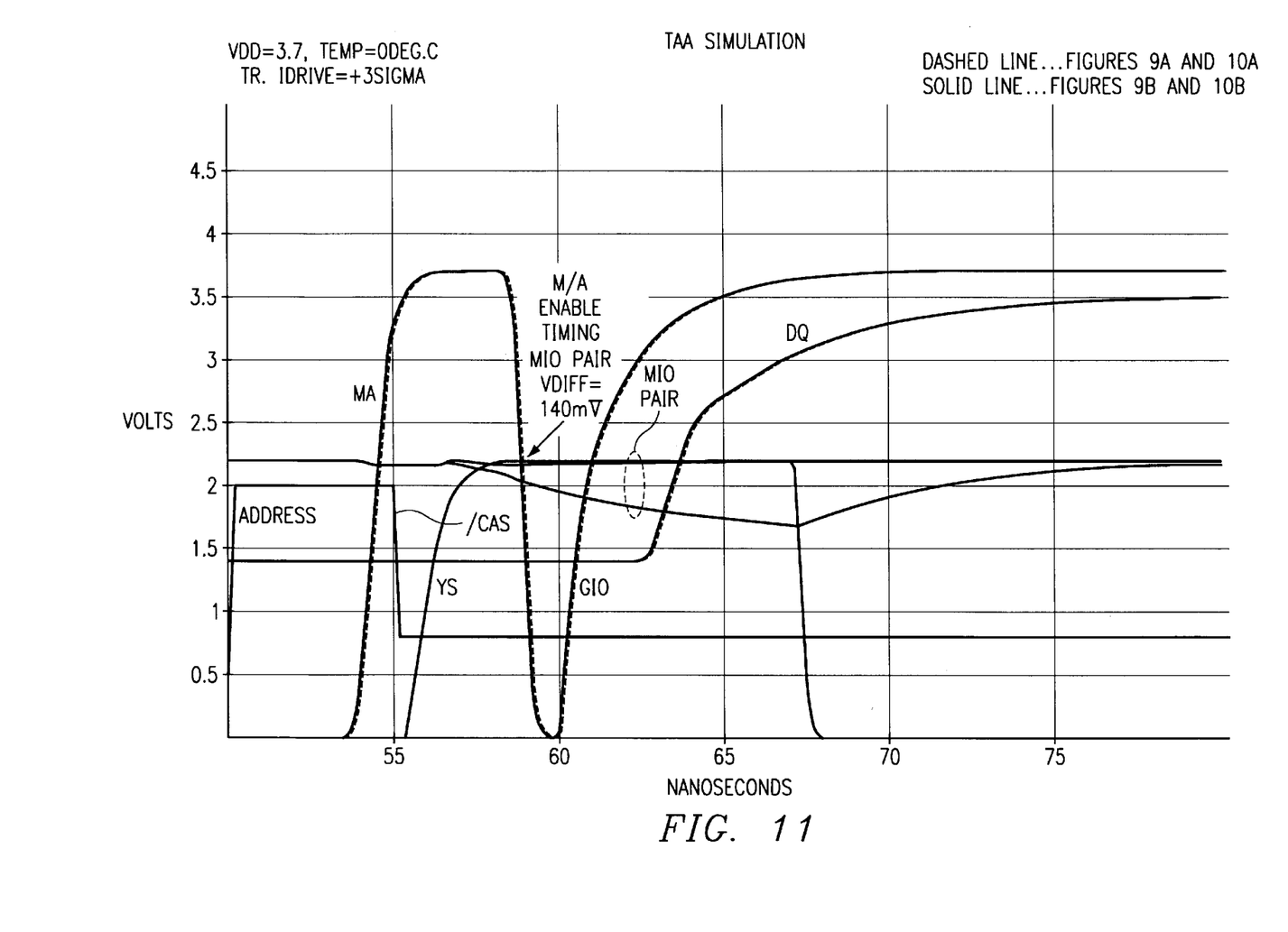
FIG. 11 is a diagram of voltage versus time showing simulated results comparing delay times in the fast access speed condition for the memory circuit of FIG. 8.

FIG. 11 is a diagram of voltage versus time showing simulated results comparing delay times in the fast access speed condition. The dashed line shows the conventional circuits of FIGS. 9A and 10A, and the solid line shows the circuits of FIGS. 9B and 10B according to the present invention. As can be seen in FIG. 11, both access speeds are essentially the same.

Figure 12:
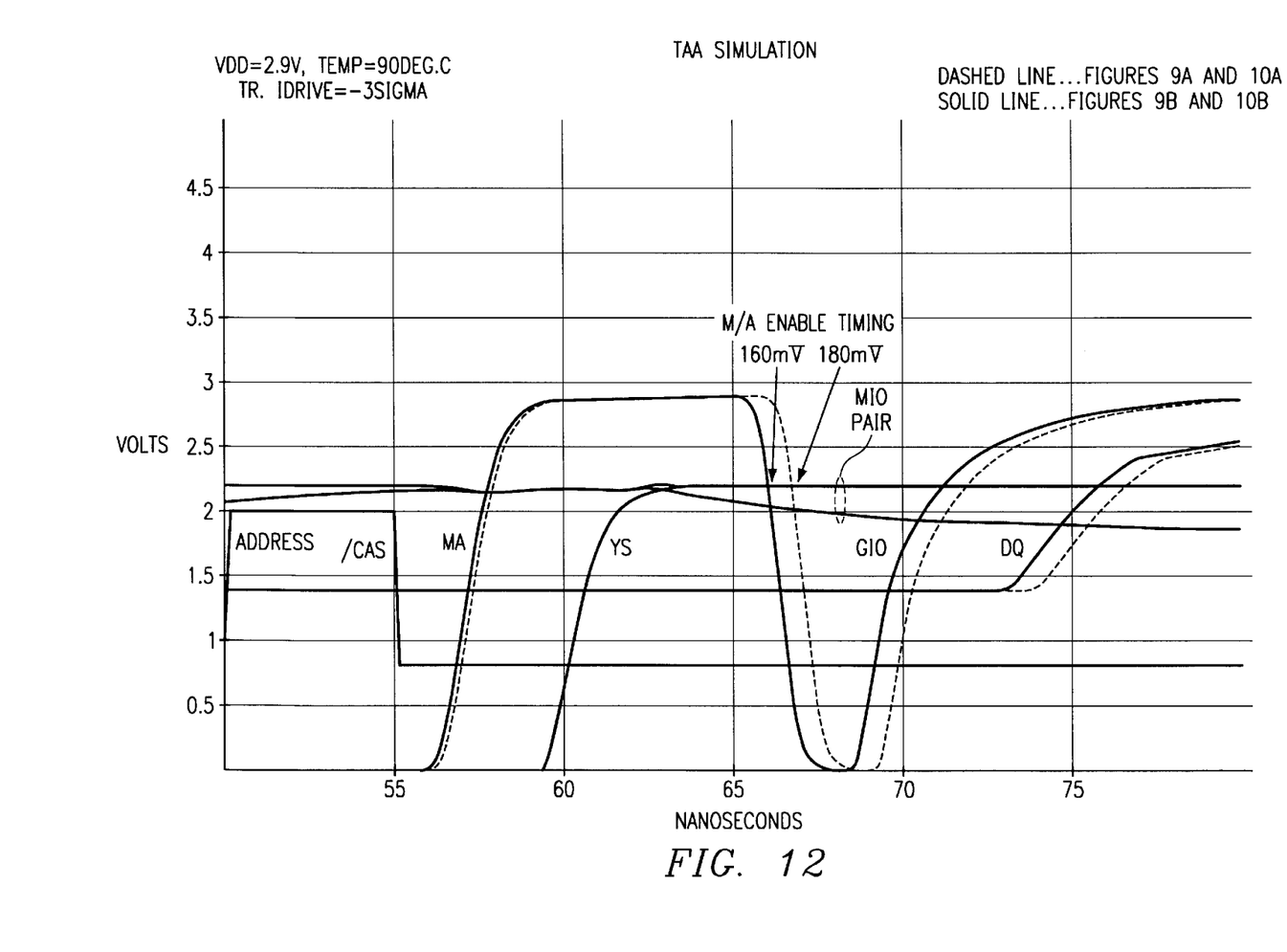
FIG. 12 is a diagram of voltage versus time showing simulated results comparing delay times in a slow access speed condition for the memory circuit of FIG. 8.

FIG. 12 is a diagram of voltage versus time showing simulated results comparing delay times in a slow access speed condition. The dashed line shows the conventional circuits of FIGS. 9A and 10A, and the solid line shows the circuits of FIGS. 9B and 10B according to the present invention. In this slow access speed condition, $V_{DD}$ equals 2.9 volts, Ta equals 90° Celsius, and transistor drive current has –3 sigma fluctuation. As can be seen in FIG. 12, the access time of the circuit according to the present invention is about one nanosecond faster than that of the conventional circuit when tAA is about 25 nanoseconds. Note that the MA signal is activated when the MIO pair is about 140 millivolts difference in FIG. 11. This is typically the minimum timing margin for which the MA signal should wait. In FIG. 12, the circuit of the present invention activates the MA signal when the MIO pair is 160 millivolts difference. Thus, it still has enough margin. However, the conventional circuit activates the MA signal when the MIO pair has 180 millivolts difference. This is significantly more of a margin than needed and causes the access time to be slower.

Figure 13:
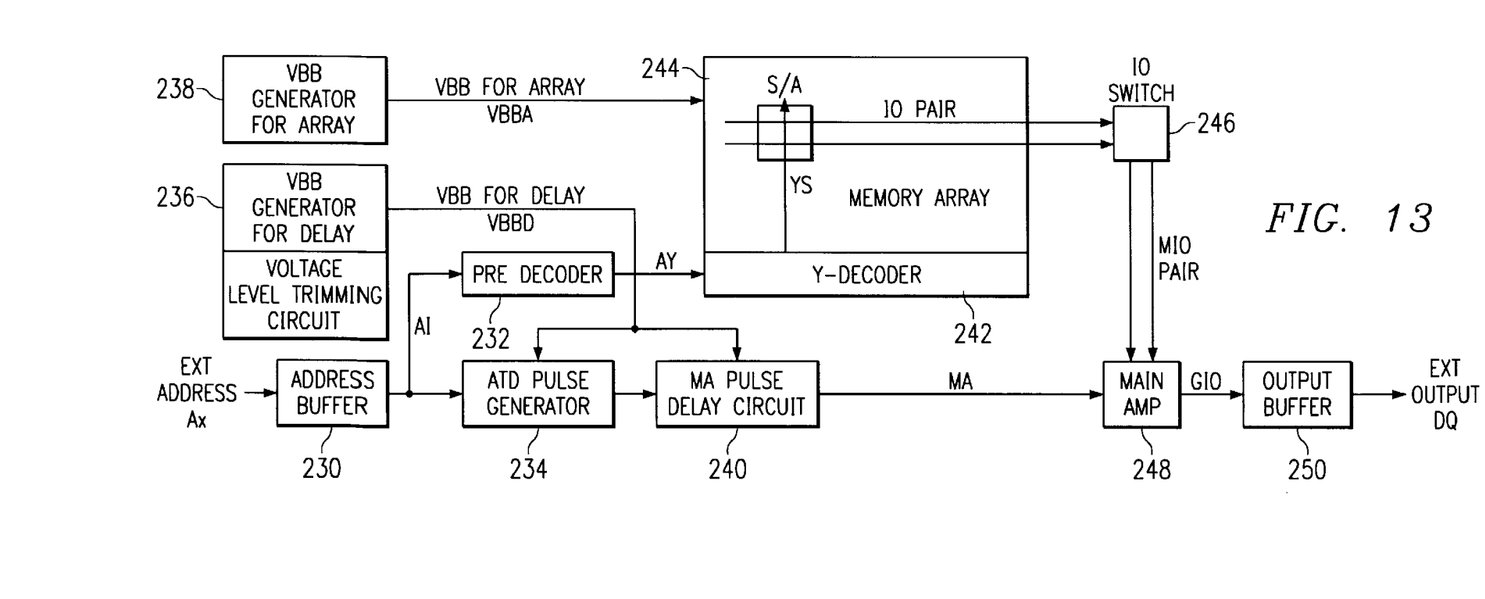
FIG. 13 is a block diagram of another embodiment of a memory device constructed according to the present invention.

FIG. 13 is a block diagram of another embodiment of a memory device constructed according to the present invention. As shown, address buffer 230, pre-decoder 232, ATD pulse generator 234, MA pulse delay circuit 240, memory array 244, Y-decoder 242, I/O switch 246, main amplifier 248 and output buffer 250 are connected together and operate in the manner of the memory device of FIG. 8. However, in contrast, the memory device of FIG. 13 includes two $V_{BB}$ generators. The first $V_{BB}$ generator 236 is for ATD pulse generator 234 and MA pulse delay circuit 240, and the second $V_{BB}$ generator 238 is for memory array 244. $V_{BB}$ generator 238 for the memory array can be a stable, constant voltage while $V_{BB}$ generator 236 for the delay can have a voltage level trimming circuit as shown. The voltage level trimming circuit can be realized, for example, by laser fused programming. This circuit can then be used to control the $V_{BB}$ level after the wafer process is complete to adjust the delay time (such as MA and MIO pair timing margin) against process parameter fluctuation.

Although the present invention has been described in detail, it should be understood that various changes, substitutions and alterations can be made thereto without departing from the spirit and scope of the invention as defined by the appended claims.

What is claimed is:

1. A semiconductor memory device, comprising:
    an address buffer having an input and an output;
    a pre-decoder circuit coupled to receive the output of the address buffer;
    a memory array coupled to receive an output of the pre-decoder circuit;
    a main amplifier coupled to receive an output of the memory array;
    an address transition detector (ATD) pulse generator circuit coupled to receive the output of the address buffer;
    a pulse delay circuit coupled to receive an output of the address transition detector pulse generator circuit, and the pulse delay circuit coupled to provide a main amplifier signal to the main amplifier; and
    a voltage generator generating a back gate voltage, the voltage generator coupled to provide the back gate voltage to cells in the memory array and as a low voltage supply for the address transition detector (ATD) pulse generator circuit and the pulse delay circuit;
    the address transition detector (ATD) pulse generator and the pulse delay circuit having a delay that is controlled by the back gate voltage and has a reduced dependency on a high voltage supply of the memory device.

2. The semiconductor memory device of claim 1, wherein the pulse delay circuit comprises:
    a voltage level swing converter circuit operable to convert a swing of an input signal to an intermediate signal having a swing between the back gate voltage and the high voltage supply; and
    a delay circuit operable to receive the intermediate signal and to provide a delayed output signal.

3. The semiconductor memory device of claim 2, wherein the voltage level swing converter circuit is a level shifter circuit and the delay circuit is an asymmetric delay circuit.

4. The semiconductor memory device of claim 1, wherein the high voltage supply is $V_{DD}$ and the back gate voltage is $V_{BB}$ in a DRAM device.

5. A semiconductor memory device, comprising:
    an address buffer having an input and an output;
    a pre-decoder circuit coupled to receive the output of the address buffer;
    a memory array coupled to receive an output of the pre-decoder circuit;
    a main amplifier coupled to receive an output of the memory array;
    an address transition detector (ATD) pulse generator circuit coupled to receive the output of the address buffer;
    a pulse delay circuit coupled to receive an output of the address transition detector pulse generator circuit, and the pulse delay circuit coupled to provide a main amplifier signal to the main amplifier; and
    a first voltage generator generating a first back gate voltage and coupled to provide the first back gate voltage to cells in the memory array; and
    a second voltage generator generating a second back gate voltage and coupled to provide the second back gate voltage as a low voltage supply for the address transition detector (ATD) pulse generator circuit and the pulse delay circuit;
    the address transition detector (ATD) pulse generator and the pulse delay circuit having a delay that is controlled by the second back gate voltage and has a reduced dependency on a high voltage supply of the memory device.

6. The semiconductor memory device of claim 5, wherein the second voltage generator includes a voltage level trimming circuit that can be used to adjust the second back gate voltage and thereby adjust the delay.

7. The semiconductor memory device of claim 5, wherein the pulse delay circuit comprises:
    a voltage level swing converter circuit operable to convert a swing of an input signal to an intermediate signal having a swing between the second back gate voltage and the high voltage supply; and
    a delay circuit operable to receive the intermediate signal and to provide a delayed output signal.

8. The semiconductor memory device of claim 7, wherein the voltage level swing converter circuit is a level shifter circuit and the delay circuit is an asymmetric delay circuit.

9. The semiconductor memory device of claim 5, wherein the high voltage supply is $V_{DD}$ and the back gate voltage is $V_{BB}$ in a DRAM device.

* * * * *

UNITED STATES PATENT AND TRADEMARK OFFICE
CERTIFICATE OF CORRECTION

PATENT NO. : 6,034,920
DATED : March 7, 2000
INVENTOR(S) : Shunichi Sukegawa, et. al.

It is certified that error appears in the above-identified patent and that said Letters Patent is hereby corrected as shown below:

Title page, insert the following:

--Related U.S. Application Data
[60] Provisional Application No. 60/066,671, Nov. 26, 1997--

Column 1, line 2, insert the following:

--CROSS REFERENCE TO RELATED APPLICATION
Reference is made to and priority claimed from U.S. Provisional application Ser. No. US 60/066,671, filed Nov. 26, 1997, entitled SEMICONDUCTOR MEMORY DEVICE HAVING A BACK GATE VOLTAGE CONTROLLED DELAY CIRCUIT.--.

Signed and Sealed this

Ninth Day of January, 2001

*Attest:*

*Attesting Officer*

Q. TODD DICKINSON
*Commissioner of Patents and Trademarks*